United States Patent [19]
Smith

[11] Patent Number: 5,028,129
[45] Date of Patent: Jul. 2, 1991

[54] DIFFERENTIAL ABSORPTION RANGING METHOD AND APPARATUS

[75] Inventor: Robert J. Smith, Boulder, Colo.

[73] Assignee: Ball Corporation, Muncie, Ind.

[21] Appl. No.: 461,502

[22] Filed: Jan. 5, 1990

[51] Int. Cl.$^5$ .......................... G01C 3/08; G01S 13/08
[52] U.S. Cl. ........................................ 356/4; 356/432; 356/437; 356/435; 342/129
[58] Field of Search .................. 356/4, 5, 432–437; 342/125, 128, 129

[56] References Cited

U.S. PATENT DOCUMENTS

| | | | |
|---|---|---|---|
| 3,103,586 | 9/1963 | Ovrebo et al. | 356/4 |
| 3,600,090 | 8/1971 | Wood et al. | 356/5 |
| 4,594,000 | 6/1986 | Falk et al. | 356/5 |
| 4,830,486 | 5/1989 | Goodwin | 356/5 |

FOREIGN PATENT DOCUMENTS 2127537 4/1984 United Kingdom .

OTHER PUBLICATIONS

Murray, Edward R., "Remote Measurement of Gases Using Differential-Absorption Lidar", *Optical Engineering*, vol. 17, No. 1, Jan.–Feb. '78, pp. 30–38.

*Primary Examiner*—Linda J. Wallace
*Attorney, Agent, or Firm*—Gilbert E. Alberding

[57] ABSTRACT

The distance between two objects, such as aircraft, helicopters and other vehicles, can be determined by transmitting from a first object through atmosphere a first frequency which is absorbed by atmosphere and a second frequency which is not absorbed by atmosphere, receiving at a second distant object the first and second frequencies, and determining from the received first and second frequencies the distance between the first and second objects. In preferred methods and apparatus, the first frequency is a frequency characteristic of atmospheric oxygen absorption (e.g., 760 nm wavelength), and the frequency transmission comprises emitting a laser light beam while modulating its frequency through a frequency range which is greater than a frequency range characteristic of atmospheric oxygen absorption (e.g., 750 nm–770 nm wavelength) and includes a second frequency which is not absorbed by atmosphere.

37 Claims, 7 Drawing Sheets

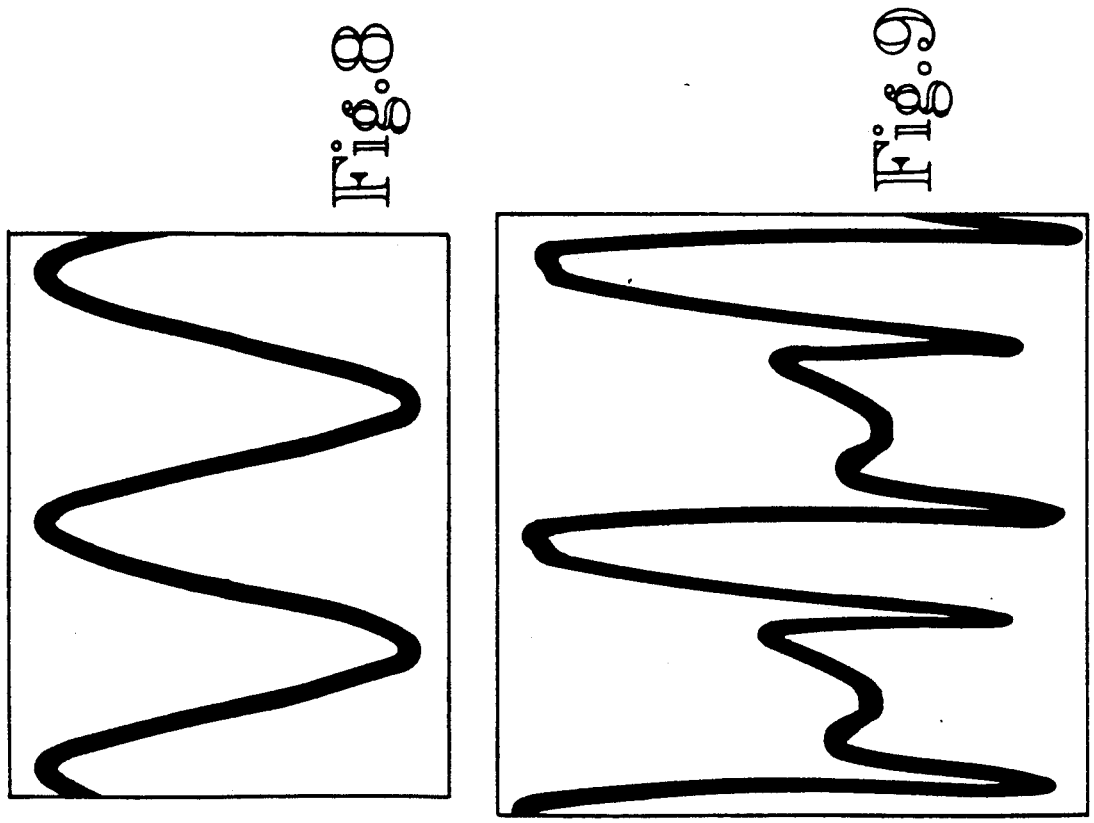

DIFFERENTIAL ABSORPTION RANGING METHOD AND APPARATUS

TECHNICAL FIELD

This invention relates to methods and apparatus for determining distance between objects and, more particularly, relates to methods and apparatus for determining the distance between two objects through differential atmospheric absorption at two or more frequencies.

BACKGROUND ART

Differential absorption of electromagnetic radiation by the atmosphere is well known and has been used in various past systems. U.S. Pat. No. 3,103,586, for example, discloses a system to determine the distance from an object at elevated temperature by sensing its infrared radiation, comparing the strength of the signal at the frequency characteristic of the absorption of infrared radiation by $H_2O$ or $CO_2$ with the strength of the signals at frequencies adjacent the frequency characteristic of such absorption by $CO_2$ or $H_2O$, and determining from the fraction of energy absorbed by $H_2O$ or $CO_2$, from non-linear information on the relationship of $CO_2$ density and altitude and from the gas pressure or effective gas pressure, the distance from the hot object to the detecting system. The system of U.S. Pat. No. 3,103,586 depends upon a complex electromechanical system that determines distance from the mechanical positioning of optical elements such as interference filters and glass, clay or comb filters and from various stored non-linear data.

U.S. Pat. No. 3,803,595 discloses a system for exciting various atmospheric pollutants with electromagnetic radiation, and detecting and locating such pollutants by their characteristic electromagnetic radiation as a result of their excitation.

U.S. Pat. No. 4,277,170 discloses an aircraft proximity warning and collision avoidance device in which a first aircraft carries a laser beacon and a second aircraft carries an optical detection device designed to alert the pilot of a potential collision threat. To provide discrimination of a signal from background light and noise, the system of U.S. Pat. No. 4,277,170 provides a spectral width on the order of 1/millionth of the visual spectrum, collimates the laser beam, provides the laser beam with a known single polarization, sweeps the collimated laser beam through 360° of horizon and provides a plurality of detectors on the second aircraft. The system distinguishes signals by a known scanning rate of laser. The distance between the laser beacon and second aircraft is determined from the known scanning rate of the laser beacon, the distance between a plurality of detectors on the receiving aircraft and the time delay between detection of the scanning laser beam by the plurality of detectors.

U.S. Pat. No. 4,755,818 discloses an aircraft collision warning system employing a low power omnidirectional pulsed laser source in one aircraft and an omnidirectional laser receiver in another aircraft which operates a light or audio device in the event it detects the laser output of another aircraft.

DISCLOSURE OF THE INVENTION

This invention provides methods and apparatus for determining the distance between two objects such as aircraft, helicopters and other vehicles.

Distance is determined by transmitting from a first object through atmosphere a first frequency which is absorbed by atmosphere and a second frequency which is not absorbed by atmosphere, receiving at a second distant object the first and second frequencies, and determining from the received first and second frequencies the distance between the first and second objects.

In preferred methods, the first frequency is a frequency characteristic of atmospheric oxygen absorption, and the frequency transmission comprises emitting a laser light beam while modulating its frequency through a frequency range which is greater than a frequency range characteristic of atmospheric oxygen absorption and includes a second frequency which is not absorbed by atmosphere. In such preferred methods, the frequency modulated laser light beam is preferably scanned in azimuth. In such a preferred method, the receiving means for the frequency modulated laser light includes an optical receiver providing a signal that is analyzed to determine, from the signal strength at said frequencies within the frequency range of modulation, the distance between the two objects. In a preferred method, a laser light is generated with a center wavelength of about 760 nanometers ("nm") and modulated through wavelengths of about 0.1nm and preferably within a range from about 750nm to about 770nm, and the received frequency modulated laser light is analyzed by developing a signal proportional to the intensity of the received modulated laser light beam throughout the frequency range of its modulation, filtering the signal to remove the frequency at which the laser light is modulated, and determining the distance between the two objects from signal spikes in the signal representing atmospheric oxygen absorption.

In other embodiments of the invention, the first and second frequencies can comprise microwave radiation with the first frequency being subject to the absorption by the gasses of the atmosphere and the second frequency being unaffected by absorption by atmospheric gasses. The first frequency and second frequency can be transmitted simultaneously, and in such embodiments of the invention, the distance can be determined by providing a first output proportional to the strength of the received first signal frequency and a second output proportional to the strength of the received second frequency and comparing the first and second outputs to determine and display the distance between the two objects.

Apparatus for practicing this invention comprises a first means for transmitting through atmosphere atmospheric sensitive frequencies, meaning at least a first frequency which is absorbed by one or more atmospheric gasses, and a second frequency which is not absorbed by atmospheric gasses, and second means for receiving at least the first and second frequencies and for determining the distance from the first means. Preferably, the first means provides frequency modulated laser light and the first frequency is a frequency characteristic of absorption of laser light by atmospheric oxygen. In such systems, the first means is provided with means for modulation of the transmitted laser light through a frequency range greater than the range of frequencies characteristic of the laser light absorption by atmospheric oxygen. The second means of such systems comprises an optical receiver adapted to provide an output proportional to the signal strength at each frequency of the received frequency modulated laser light, and further comprises means for analyzing the receiver output to determine, from signal strengths in the frequency range of modulation, the distance between the first and second means. In such first means, laser light is emitted with a center wavelength of 760nm and modulated through wavelengths of about 0.1nm and preferably within a wavelength range of about 750nm to about 770nm. The second means of such a preferred system includes the signal detector providing an output proportional to the intensity of the received frequency modulated laser light at each frequency throughout the frequency of modulation, a filter for the detector output to remove the frequency at which the laser light is modulated and a circuit to determine, from the strength of signal spikes representing oxygen absorption, the distance between the two objects.

In another embodiment of the invention, the first means can comprise a separate means to transmit the first frequency at a predetermined power and another separate means to transmit the second frequency at the same predetermined power, and the second means can comprise a first receiver tuned to receive the first frequency, a second receiver tuned to receive the second frequency and electrical circuitry to provide a ratio of the first and second signals and to provide an output from which distance can be determined and/or displayed.

Unlike prior systems, the invention eliminates conventional ranging which relies on echoed or rebounding signals and is relatively covert, is sensitive and accurate, takes little power in its operation, is compact, is well suited to use in inclement weather, can serve as a covert communication link and provides accurate range rate data with fast updates.

Other features and advantages of the invention will be apparent from the drawings and description that follow.

BRIEF DESCRIPTION OF THE DRAWINGS

FIG. 8 is an oscillograph trace showing the signal received by a second means of the invention from a frequency modulated laser light source of the first means of the invention at zero spacing;

FIG. 9 is an oscillograph trace showing the signal received by a second means of the invention from a frequency modulated laser light source of the first means of the invention at, for example, 10 meters;

FIGS. 10-12 are oscillograph traces showing the development of a signal for the determination of distance from a received frequency modulated laser light signal such as that shown in FIG. 9;

BEST MODES FOR CARRYING OUT THE INVENTION

Conventional radar and ranging systems yield range information by bouncing the signal off a distant object and timing the signal's return. Because only a small fraction of the signal is returned to the source, high power is required to obtain reliable range information, particularly in bad weather. Such high powered signals are frequently readily detectable by an enemy.

The invention permits, for example, one aircraft to determine another's range by simply analyzing a received wave form, eliminating the need for echoed or rebounding transmissions and substantially reducing the power that must be transmitted. The invention relies upon the electromagnetic radiation absorption characteristics of atmosphere, and preferably upon the characteristic absorption of laser light by atmospheric oxygen. Although atmospheric constituents of unpredictable density, such as fog, rain, smoke and the like, scatter light out of a beam regardless of the frequency of the light, only oxygen can effect the resonance ratio of the power of a laser light signal at a frequency at which it is absorbed by oxygen and a second frequency at which it is not absorbed.

Figure 1:
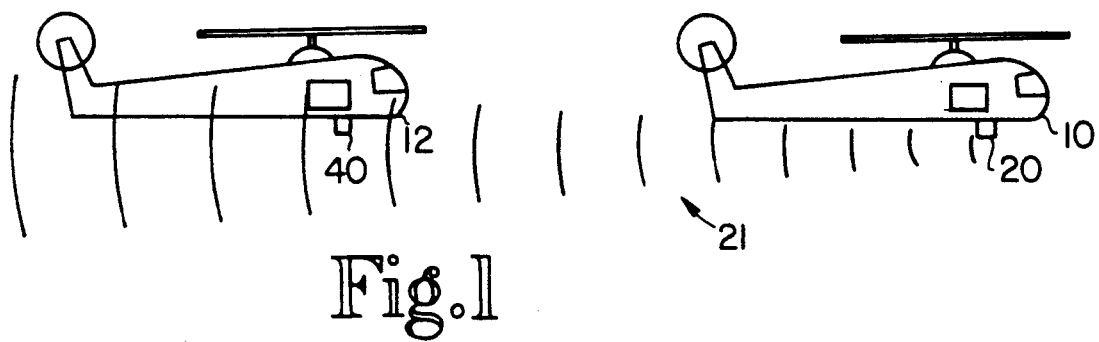
FIG. 1 is a drawing of a system of the invention as incorporated into a pair of helicopters.
Figure 2:
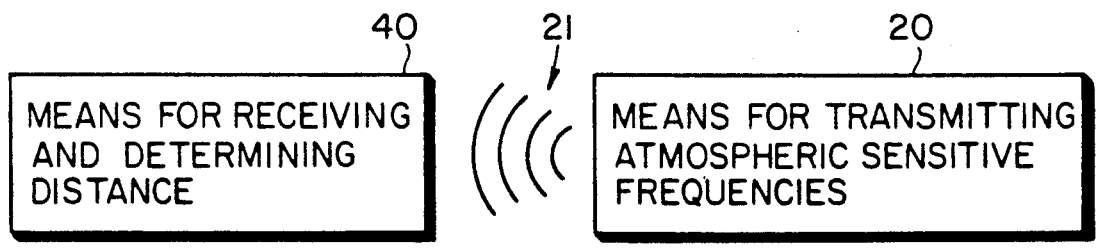
FIG. 2 is a simplified block diagram to show the first and second means of the invention incorporated into the helicopters of FIG. 1.

FIGS. 1 and 2 illustrate a system of the invention for determining the distance between two objects, such as helicopters. In FIGS. 1 and 2, the first object, or helicopter 10, is provided with a means 20 for transmitting atmospheric sensitive frequencies. A second object, or helicopter 12, is provided with a second means 40 for receiving and determining the distance to the first object from the transmitted atmospheric sensitive frequencies of the first means 20.

Figure 3:
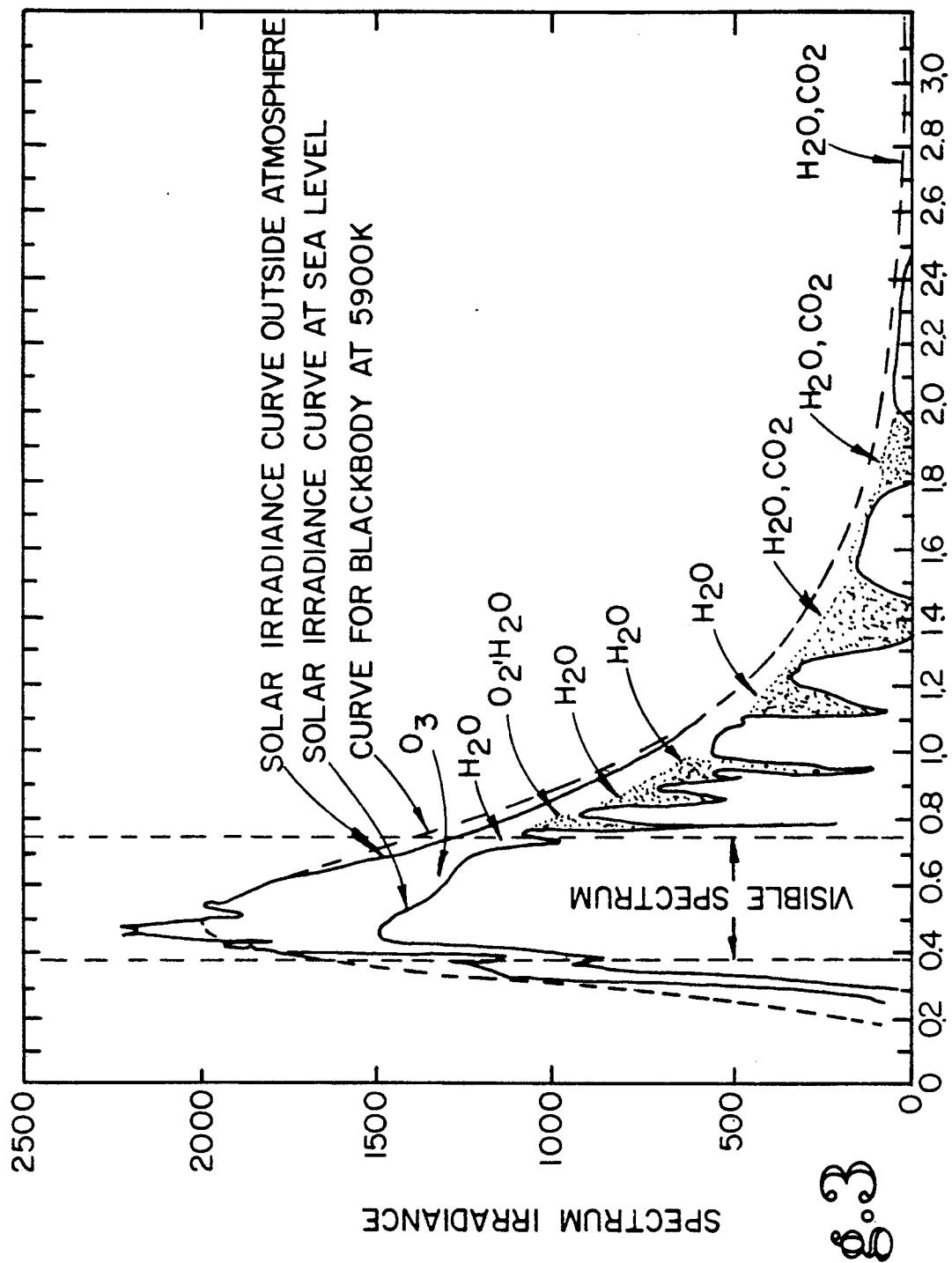
FIG. 3 is a graph showing the frequency absorption characteristics of the various gasses of atmosphere.

FIG. 3 shows atmospheric sensitive frequencies, that is, the frequencies characteristic of absorption of electromagnetic radiation by the various gasses in the atmosphere. In determining the distance between two objects, the invention transmits and uses at least a first frequency which is absorbed by at least one atmospheric gas and a second frequency which is not absorbed by atmosphere; such frequencies lie in a frequency range which will be referred to herein as "atmospheric sensitive frequencies".

Figure 4:
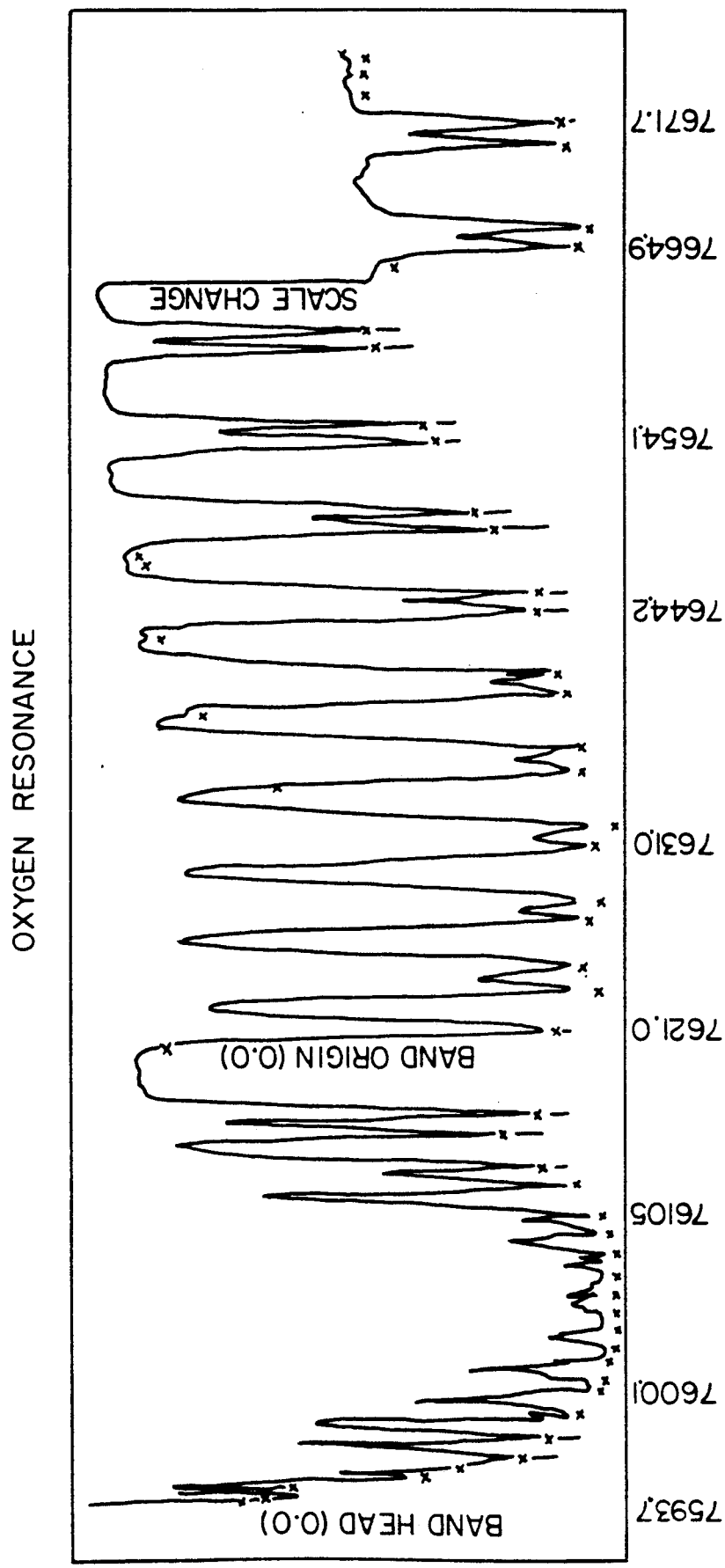
FIG. 4 is a graph showing the frequency absorption characteristics of atmospheric oxygen on an expanded scale.
Figure 5:
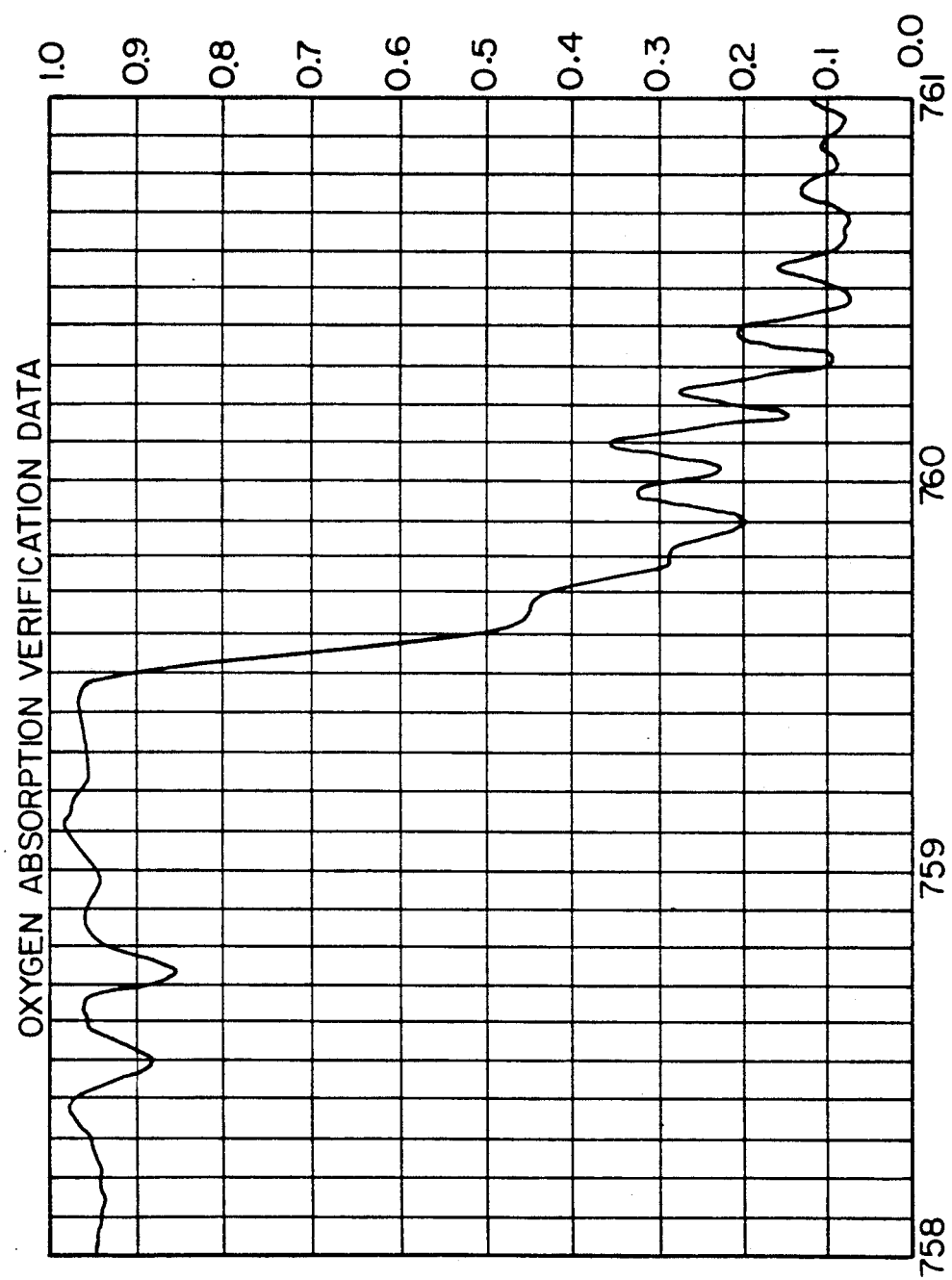
FIG. 5 is a graph showing the power absorption due to atmospheric oxygen at wavelengths from 758nm to 761nm.

In a preferred method and apparatus of the invention I use the absorption of laser light, preferably at a wavelength of about 760nm. As shown in FIG. 4, which is an expanded portion of the graph of FIG. 3 about the frequencies characteristic of atmospheric oxygen absorption, absorption of electromagnetic radiation by atmospheric oxygen occurs at wavelengths of about 759nm through about 768nm, and particularly within frequency range with wavelengths from about 759nm through about 761nm. The absorption of laser light energy in this frequency range is illustrated by FIG. 5 which shows, on a unit scale, the power of light received from the sun whose emission includes light at wavelengths from 758nm to 761nm.

In a preferred method of the invention, one object with a source of frequency modulated laser light and another object with an optical receiver are provided. By emitting laser light from the first object while modulating its frequency through a frequency range greater than a frequency range characteristic of an atmospheric oxygen absorption line, that is, a range greater than one or more of the ranges shown in FIG. 4, the distance at the second object can be determined by receiving the frequency modulated laser light beam and analyzing the received frequency modulated laser light to determine from the signal strengths in the frequency range of modulation the distance between the two objects. Distance can be determined in such a method by generating laser light with a center frequency of 760nm and modulating the laser light through a wavelength range of approximately 0.1nm, but it is preferable to modulate other oxygen absorption wavelengths within the range from about 750nm to about 770nm. In such systems to the invention, the laser light is preferably modulated at a frequency between 1 kilohertz ("kH") and 1 megahertz. In this preferred method, the received frequency modulated laser light is analyzed by providing a signal proportional to the intensity of the received frequency modulated laser light, preferably throughout the range of frequency modulation, by filtering the signal to remove the frequency at which the laser light is modulated, and by determining from the strength of signal spikes, representing oxygen absorption, the distance between the two objects.

Figure 6:
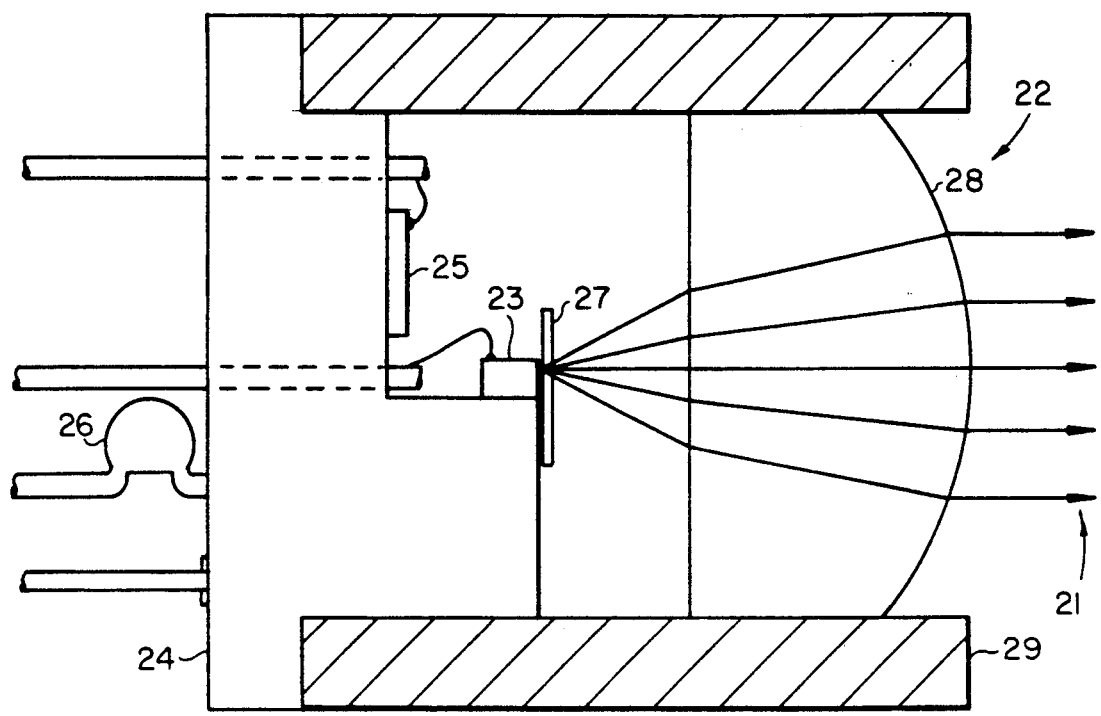
FIG. 6 is a simplified diagram of a laser light source of a first means of the invention.
Figure 7:
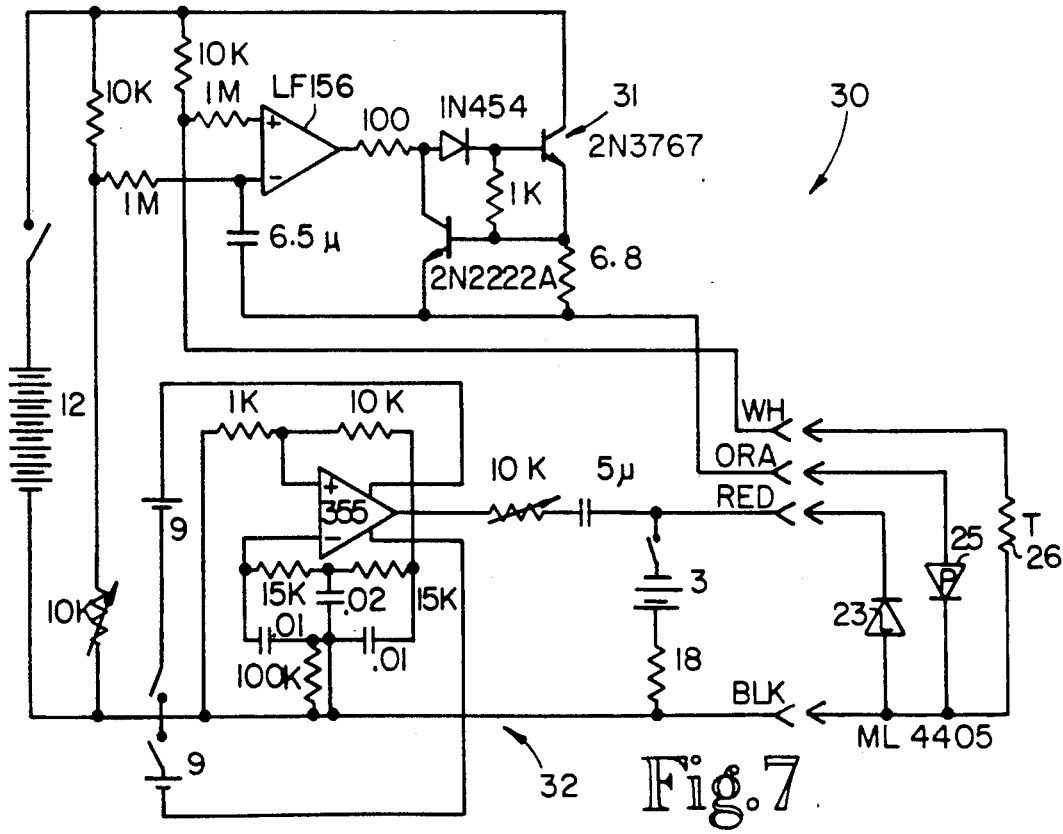
FIG. 7 is a circuit diagram of a first means circuit for operating the laser light source of FIG. 6.

FIGS. 6 and 7 show a first means of the invention for providing frequency modulated laser light. The first means of FIGS. 6 and 7 is preferably adapted for modulation of the emitted laser light through a frequency range greater than a frequency range characteristic of one of the atmospheric oxygen absorption lines shown in FIG. 4.

As shown in FIGS. 6 and 7, the first means of the invention includes a laser light emitting source 22, shown in FIG. 6, and circuitry 30, shown in FIG. 7, to control the laser light source 22.

As shown in FIG. 6, the laser light source 22 includes a laser 23 carried on a copper heat sink 24, whose temperature is controlled by heater 25 by a circuit including thermistor 26 in heat transfer relationship with the copper heat sink 24. The output of laser 23 is directed through a mode selection means 27 and a lens 28 to form the laser light into a beam 21 for transmission to the second object. As shown in FIG. 6, lens 28 may be carried by lens barrel 29 mounted on the heat sink 24 to thereby position a lens 28 with respect to the laser 23. The laser light beam 21 may be scanned in azimuth by means and methods well known in the art.

Circuit means 30 shown in FIG. 7 comprises means 31 for controlling the temperature of the laser 23 and means 32 for operating the laser to sweep the wavelength of the emitted laser light through a frequency range of atmospheric oxygen absorption shown in FIG. 4. Circuit means 32 of FIG. 7 preferably operates laser 23 to provide a central frequency having a wavelength of about 760nm and to sweep the laser light wavelength within a range from about 750nm to about 770nm.

The resulting laser light beam 21 travels through atmosphere from the first object to the second object as shown in FIGS. 1 and 2. As the laser light beam 21 travels through atmosphere, the oxygen present in the atmosphere absorbs energy from the transmitted laser light beam at the frequencies shown in FIG. 4. As a result, the power of the transmitted laser light beam is diminished at frequencies characteristic of atmospheric oxygen absorption, for example, at frequencies having a wavelength of about 760nm, as shown in FIG. 4, and the received power at second object at first frequencies characteristic of absorption by atmospheric oxygen is reduced proportional to the distance from the laser light source (i.e., the first object) and the amount of oxygen present between the two objects as compared with second frequencies which are not absorbed by the gasses in the atmosphere.

FIG. 8 is an oscillograph trace generated by a received frequency modulated laser light signal. The oscillograph trace of FIG. 8 shows a sinusoidal variation in signal strength that corresponds to the frequency modulation of the laser light signal because the power output of the laser varies with its wavelength. FIG. 8 illustrates a received frequency modulated laser light signal of a receiving means located at substantially zero spacing from a laser light source modulated about a center frequency with a wavelength of about 760nm.

FIG. 9 is an oscillograph trace of the received signal from the same laser source operating at the same frequencies (i.e., frequency modulated about a center frequency with a wavelength of about 760nm) but located at a distance of 10 meters. FIG. 9 illustrates the difference in signal strength due to absorption of laser light energy by atmospheric oxygen in the 10 meter interval between the laser light source and the receiving means. The substantial downward spikes in the oscillograph trace of FIG. 9 demonstrate the absorption of energy from the laser light beam at about 760nm due to atmospheric oxygen.

Figure 13:
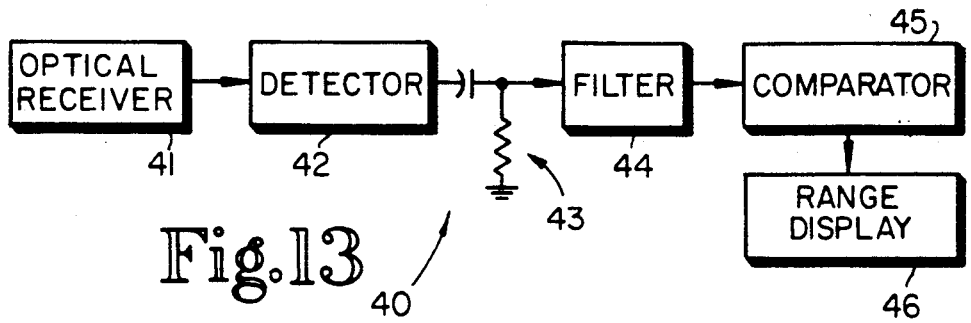
FIG. 13 is a block diagram of a second means of the invention operating as illustrated in FIGS. 9-12.

FIGS. 10-12 demonstrate how a received signal like that shown in FIG. 9 may be developed by the second means of the invention into a signal proportional to distance, and FIG. 13 shows one embodiment 40 of a second means of the invention. As shown in FIG. 13, second means 40 comprises an optical receiver 41, a detector 42 connected with the output of the optical receiver 41, an AC coupling 43 at the output of the detector to couple AC components of the detector output to an AC filter 44, a comparator circuit 45 connected with the output of the AC filter 44, and a range display 46 connected with the output of the comparator 45. The second means 40 may be provided with means to correct for changes in oxygen concentration at different altitudes where necessary for use in aircraft.

FIG. 9 illustrates the output of optical receiver 41, which is coupled to detector 42 to provide a signal including a series of spikes 42a, as shown in FIG. 10, representing the absorption of laser light by atmospheric oxygen. The signal of FIG. 10 is AC coupled to filter 44. Filter 44 is preferably a notch filter circuit such as twin "T" filter to remove the modulation frequency and provide an output signal such as that shown in FIG. 11. As indicated above, a preferred modulation frequency is 1kH, and filter 44 is designed to remove 1kH from the signal. As shown in FIG. 11, the output of filter 44 is a series of spikes, or pulses, 44a that have resulted from the absorption of laser light by atmospheric oxygen. The signal of FIG. 11, is connected with a comparator 45 which converts the "strength" of the spikes 44a to a change in duty cycle of a signal having a constant amplitude, for example 2 volts, at the output of the comparator. The duty cycle can then be converted and displayed as range by a range display circuit 46. The comparator 45 has thus served as an automatic gain control for the signal.

The second means 40 thus provides a signal with an output proportional to the intensity of the received laser light beam throughout the frequency modulation range, filters the signal to remove the frequency at which the laser light is modulated, and determines from the strength of the signal spikes representing oxygen absorption the distance of the laser light source and therefore the distance between the two objects.

Figure 14:
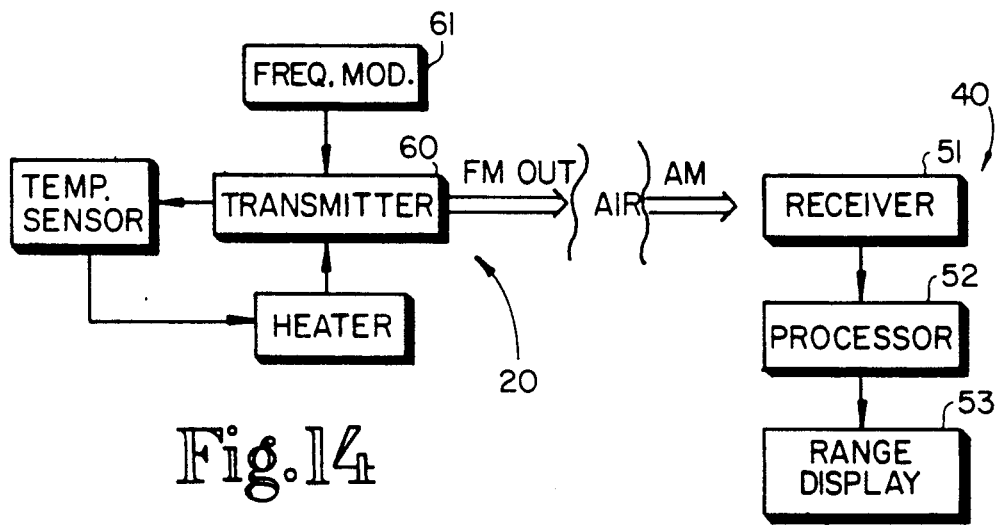
FIG. 14 is a simplified block diagram of an embodiment of an apparatus of the invention.

FIG. 14 illustrates a simplified block diagram of an apparatus of the invention including a first means 20 for transmitting electromagnetic radiation at atmospheric sensitive frequencies and a second means 40 for receiving electromagnetic radiation at atmospheric sensitive frequencies and determining from the atmospheric sensitive frequencies, the distance from the first means.

As shown in FIG. 14, such first means includes a transmitter 60 and a frequency modulator 61 connected together to provide a frequency modulated electromagnetic radiation output. The frequency modulated output of the first means 20 includes a first frequency which is absorbed by one or more atmospheric gasses and a second frequency which is not absorbed by the atmospheric gasses. Although it is preferred that transmitter 60 emit electromagnetic radiation in the form of frequency modulated laser light having a central wavelength, such as 760nm, characteristic of atmospheric oxygen absorption modulated through a frequency range including frequencies not characteristic of the atmospheric oxygen absorption of laser light, transmitter 60 can transmit electromagnetic radiation in the microwave frequency range including a first frequency absorbed by one or more gasses and vapors making up the atmosphere and the second frequency which is not absorbed by atmosphere. The first means 20 can be packaged and adapted to be carried by a first object which can be an aircraft or a helicopter or other vehicle.

The second means 40 includes a receiver 51 to receive the frequency modulated electromagnetic radiation output of the transmitter 60. Where transmitter 60 provides a frequency modulated laser light output, receiver 51 is an optical receiver and where transmitter 60 provides a frequency modulated output in the microwave range, receiver 51 is a microwave receiver having a band width sufficient to receive the frequency modulated output of the transmitter 60. The output of receiver 51 is connected with the signal processor 52 which can analyze the signal output of receiver 51 and develop from the signal strength of the first frequency at which energy is absorbed and the signal strength of the second frequency at which energy is not absorbed, a signal indicative of the distance between the first and second objects. The signal from the signal processor 52 can be connected with the range display 53 to present at the second object information on the distance to the first object. The second means 40 can also be packaged and adapted to be carried by a second object such as an aircraft, helicopter or other vehicle.

Figure 15:
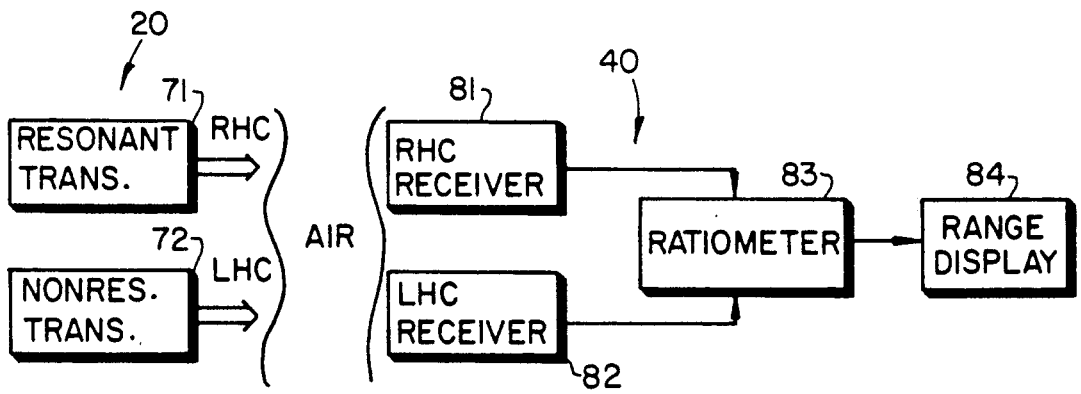
FIG. 15 is a simplified block diagram of another embodiment of an apparatus of the invention.

FIG. 15 shows another embodiment of apparatus of the invention. In the apparatus embodiment of FIG. 15, the first means 20 comprises a separate transmitter means 71 for transmitting through atmosphere a first frequency which is absorbed by one or more atmospheric gasses and another separate transmitter means 72 for transmitting through atmosphere a second frequency which is not absorbed by atmospheric gasses. The first transmitting means 71 and second transmitting means 72 are adapted to transmit the first and second frequencies with the same predetermined power output. The second means 40 of the system of the apparatus of FIG. 15 includes first receiver 81 tuned to receive the first frequency and a second receiver 82 tuned to receive the second frequency. The output of the first receiver 81 and the second receiver 82 are connected with ratiometer circuit 83 which is adapted to develop from the received signal strengths of the first and second frequencies an output signal proportional to the distance between the first means 20 and the second means 40. The output of the ratiometer circuitry 83 is connected with and drives a range display 84.

While a preferred embodiment and best mode of carrying out the invention have been described above, further embodiments will be apparent to those skilled in the art and the invention is limited only by the prior art and the scope of the following claims:

What is claimed is:

1. A method of determining distance between two objects, comprising
   providing one object with a source of frequency modulated laser light and another object with an optical receiver;
   emitting a laser light beam while modulating its frequency through a frequency range greater than a frequency range characteristic of atmospheric oxygen absorption;
   receiving the frequency modulated laser light beam at the other object; and
   analyzing the received frequency modulated laser light beam to determine from signal strengths in the frequency range of modulation the distance between the two objects.

2. The method of claim 1 including the step of generating laser light with a center wavelength of 760 nanometers and modulating the laser light through a wavelength range of approximately 0.1 nanometers.

3. The method of claim 1 wherein the laser light is modulated by varying the emitted wavelength within a range of about 750 to about 770 nanometers.

4. The method of claim 1 wherein the emitted laser light is scanned in azimuth.

5. The method of claim 1 wherein said received laser light is analyzed by
   providing a signal proportional to the intensity of the received laser light beam;
   filtering said signal to remove the frequency at which the laser light is modulated; and
   determining from the strength of signal spikes representing oxygen absorption the distance between the two objects.

6. Apparatus for determining the distance between two objects, comprising
   first means for providing a beam of frequency modulated laser light,
   said first means being adapted for modulation of the emitted laser light beam through a frequency range greater than a frequency range characteristic of absorption by atmospheric oxygen; and
   second means for receiving said frequency modulated laser light beam,
   said second means being adapted for analyzing the received frequency modulated laser light beam to determine from signal strengths in the frequency range of modulation the distance between said first and second means.

7. The apparatus of claim 6 wherein said first means includes a laser light generator with a center wavelength of 760 nanometers and a modulator adapted to modulate the laser light through a wavelength range of about 0.1 nanometers.

8. The apparatus of claim 6 wherein said first means includes a laser light modulator adapted to vary the emitted wavelength within a range of about 750 to about 770 nanometers.

9. The apparatus of claim 6 wherein said first means includes scanning means to vary the direction of the emitted laser light beam in azimuth.

10. The apparatus of claim 6 wherein said second means includes:
a signal detector with an output signal proportional to the intensity of the received laser light beam;
a filter for said output signal of said signal detector to remove the frequency at which the laser light is modulated; and
a circuit to determine the strength of signal spikes representing oxygen absorption and the distance between the two objects.

11. The apparatus of claim 6 wherein said first means comprises a laser, a heat sink upon which said laser is carried, a heater and a constant temperature control for said laser, and a lens to focus and transmit said laser light beam from said laser to said second means.

12. The apparatus of claim 11 wherein said first means further comprises a mode selection means between said laser and said lens.

13. The apparatus of claim 11 wherein said laser is operated to maintain a center frequency having a wavelength of about 760 nanometers.

14. The apparatus of claim 6 wherein said first means comprises a laser and first circuit means for providing a laser light output having a central wavelength of about 760 nanometers, second circuit means for controlling the temperature of said laser, and third circuit means for operating the laser to sweep the wavelength of the emitted laser light within a frequency range of 750 nanometers to about 770 nanometers.

15. Apparatus for determining the distance between two objects, comprising
a first means comprising a first transmitter of a first signal with a predetermined power output at a frequency at which said first signal is absorbed by atmosphere, and a second transmitter of a second signal at said predetermined power output at a frequency at which said second signal is not absorbed by atmosphere; and
a second means comprising a receiving means for said first signal and for said second signal, and a distance determination means for determining the distance of said second means from said first means from the received first and second signals.

16. The apparatus of claim 15 wherein said second means comprises a first receiver tuned to receive said first signal, a second receiver tuned to receive said second signal, a ratiometer connected with said first and second receivers to provide an output from which distance can be displayed.

17. A method of determining distance between two objects, comprising the steps of
transmitting from a first object through atmosphere a first frequency which is absorbed by atmosphere and a second frequency which is not absorbed by atmosphere;
receiving at a second distant object said first and second frequencies;
providing a first output proportional to the strength of the received first frequency;
providing a second output proportional to the strength of the received second frequency; and
comparing the first and second outputs and determining from said first and second outputs the distance between the said first and second objects; and
displaying the distance between the two objects.

18. The method of claim 17 wherein said objects are vehicles.

19. The method of claim 17 wherein said objects are helicopters.

20. The method of claim 17 wherein said transmitting step comprises transmitting a frequency modulated microwave signal comprising said first and second frequencies.

21. The method of claim 20 wherein said distance determining step comprises analyzing the frequency modulated microwave signal received at said second object to determine from the signal strengths in the frequency range of modulation the distance between the two objects.

22. The method of claim 17 wherein said first frequency is a frequency characteristic of atmospheric oxygen absorption, and said transmitting step comprises emitting a laser light beam while modulating its frequency through a frequency range greater than a frequency range characteristic of atmospheric oxygen absorption and including said second frequency.

23. The method of claim 22 wherein said receiving step comprises receiving said frequency modulated laser light beam with an optical receiver and analyzing the received frequency modulated laser light beam to determine from signal strengths in the frequency range of modulation the distance between the two objects.

24. The method of claim 22 wherein the laser light is modulated by varying the emitted wavelength within a range of about 750 to about 770 nanometers.

25. The method of claim 22 wherein the emitted laser light is scanned in azimuth.

26. The method of claim 22 including the step of generating laser light with a center wavelength of 760 nanometers and modulating the laser light through a wavelength range of about 0.1 nanometers.

27. The method of claim 26 wherein said received laser light is analyzed by
providing a signal proportional to the intensity of the laser light beam received at said second object;
filtering said signal to remove the frequency at which the laser light is modulated; and
determining the strength of signal spikes representing oxygen absorption and the distance between the two objects.

28. Apparatus for determining the distance between two objects, comprising
first means comprising frequency generating means for generating a first frequency which is absorbed by one or more atmospheric gasses and a second frequency which is not absorbed by atmospheric gasses and transmitter means for transmitting said first and second frequencies through atmosphere; and
second means for receiving said first and second frequencies and for determining the distance from said first means.

29. The apparatus of claim 28 wherein said first means provides frequency modulated laser light, said frequency modulated laser light sweeping a frequency range including said first and second frequencies.

30. The apparatus of claim 29 wherein said first frequency is a frequency characteristic of absorption by atmospheric oxygen and said first means is adapted for modulation of the transmitted laser light through a frequency range greater than a range of frequencies characteristic of an absorption line of atmospheric oxygen.

31. The apparatus of claim 29 wherein said second means comprises an optical receiver adapted to provide an output proportional to the signal strength at each frequency of the frequency modulated laser light received by said second means, and means for analyzing the receiver output to determine from the signal strength throughout the frequency range of modulation the distance between the first and second means.

32. The apparatus of claim 30 wherein said first means includes a modulator adapted to vary the emitted wavelength within a range of about 750 to about 770 nanometers.

33. The apparatus of claim 29 wherein said first means includes scanning means to vary the direction of the emitted laser light in azimuth.

34. The apparatus of claim 29 wherein said first means includes a laser light generator with a center wavelength of about 760 nanometers and a modulator adapted to modulate the laser light through a wavelength range of about 0.1 nanometers.

35. The apparatus of claim 29 wherein said second means includes:
   a signal detector with an output signal proportional to the intensity of said first and second frequencies;
   a filter for said output of said signal detector to remove the frequency at which the laser light is modulated; and
   a circuit to determine the strength of signal spikes representing oxygen absorption and the distance between the two objects.

36. The apparatus of claim 28 wherein said first means comprises
   a first transmitter of a first signal at a predetermined power output at said first frequency at which said first signal is absorbed by atmosphere, and a second transmitter of a second signal at said predetermined power output at said second frequency at which said second signal is not absorbed by atmosphere.

37. The apparatus of claim 36 wherein said second means comprises a first receiver tuned to receive said first signal, a second receiver tuned to receive said second signal and a ratiometer connected with said first and second receivers to provide an output from which distance can be displayed.

* * * * *